United States Patent
Kappes et al.

(10) Patent No.: US 7,486,936 B2
(45) Date of Patent: Feb. 3, 2009

(54) OVER-CURRENT PROTECTION IN LINEAR REGULATORS

(75) Inventors: Michael S. Kappes, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 453 days.

(21) Appl. No.: 11/246,580

(22) Filed: Oct. 7, 2005

(65) Prior Publication Data

US 2007/0026815 A1    Feb. 1, 2007

Related U.S. Application Data

(60) Provisional application No. 60/704,113, filed on Jul. 29, 2005.

(51) Int. Cl.
*H04B 1/38* (2006.01)
(52) U.S. Cl. .................... 455/73; 455/127.1; 455/127.2; 455/127.5; 330/264; 330/267; 330/268; 327/321; 327/322; 327/563
(58) Field of Classification Search ................. 455/73, 455/127.1, 127.2, 127.5; 330/267, 264, 268, 330/269, 273, 274; 327/309, 310, 321, 322, 327/563
See application file for complete search history.

(56) References Cited

U.S. PATENT DOCUMENTS

| 2004/0003301 A1* | 1/2004 | Nguyen ...................... 713/300 |
| 2004/0178778 A1* | 9/2004 | Bansal ........................ 323/274 |
| 2004/0198301 A1* | 10/2004 | Rozenblit et al. ........ 455/343.1 |

* cited by examiner

*Primary Examiner*—Tuan A Pham
(74) *Attorney, Agent, or Firm*—Garlick Harrison & Markison; James A. Harrison

(57) ABSTRACT

An integrated circuit radio transceiver and method therefor includes a linear regulator an output transistor for producing a current into an output node of the regulator wherein an amplification block is operable to produce a bias signal to a gate terminal of the output transistor to operably bias the output transistor to produce the current into the output node of the regulator. A current steering amplification block is operably disposed to steer current in/out of the gate of the output transistor (depending on device type) based upon the current being conducted through the output node of the regulator exceeding a specified threshold. The current steering amplification block further includes a current sinking element operably disposed to sink a specified amount of current to define the specified threshold.

20 Claims, 8 Drawing Sheets

FIG. 7 current protection circuit

*FIG. 8* current protection circuit

OVER-CURRENT PROTECTION IN LINEAR REGULATORS

CROSS-REFERENCE TO RELATED APPLICATION

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/704,113, entitled "Over-Current Protection in Linear Regulators," filed Jul. 29, 2005.

BACKGROUND

1. Technical Field

The present invention relates to wireless communications and, more particularly, to circuitry for measuring and detecting a received signal strength.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

Voltage regulators are commonly used in discrete circuits as well as in integrated circuit devices to provide a steady and predictable supply. Generally, regulators are advantageous because they are capable of sourcing large amounts of current. One common problem that applies to voltage regulators, especially in integrated circuit designs, is that over-current conditions may be reached when an output is shorted or when a load resistance substantially drops due to any one of a plurality of reasons. Such over-current conditions can cause failure in the integrated circuit by damaging a portion of its embedded circuitry. Such adverse effects are known to happen even for very brief instances of a short across an output. Thus, providing current limiting is desirable. In some prior art designs, output current levels are monitored and, upon detection of a large surge of current, the entire regulator or power supply may be disabled or powered down to provide some degree of protection. One shortcoming of such approaches, however, is that the response time for powering down a power supply may be inadequate. Moreover, shutting down a power supply also requires a start up or settle time. What is needed, therefore, is a regulator that is operable to quickly respond to a short or low output impedance situation to reduce the likelihood of damaging the integrated circuit and that reduces any required settle time when transitioning back to a normal mode of operation.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
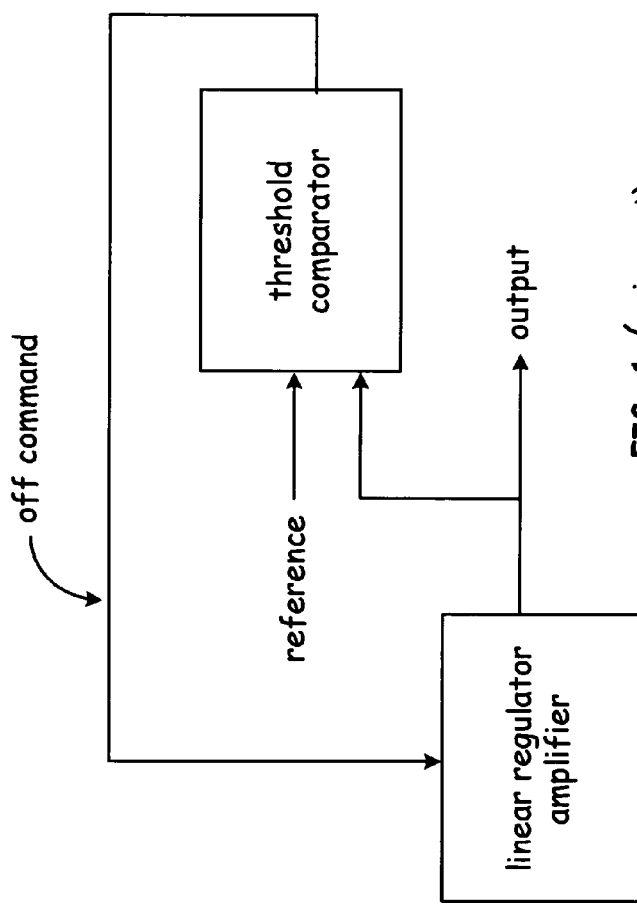
FIG. 1 is a functional block diagram of a prior art linear regulator.

FIG. 1 is a functional block diagram of a prior art linear regulator. As may be seen, a linear regulator amplifier produces an output signal which comprises a regulated output for powering a specified circuit (not shown). The output of the linear regulator amplifier is also produced to a threshold comparator that is further coupled to receive a reference signal. The threshold comparator generates an off command based upon the output of the linear regulator amplifier exceeding the reference level. The off command is produced to the linear regulator amplifier to power down the amplifier in the case of a high current condition. For example, if a short were to develop at the output of the linear regulator amplifier, the output current would exceed a specified level. Accordingly, in one embodiment of the prior art, the threshold comparator would include a full comparator detector that compares the output current level to a reference current level and turns off the power to the linear regulator amplifier during periods of excess current. The embodiment of FIG. 1 is advantageous in that some over-current protection is provided. However, because the linear regulator amplifier is powered down, damage to an integrated circuit or other circuit component may occur during the delay associated with the comparison performed by the threshold comparator and the powering off of the linear regulator amplifier in an over-current condition. Moreover, once the short or over-current condition is removed, powering the linear regulator amplifier back on has an intrinsic settle time that may cause the overall integrated circuit to not meet settle time requirements. As such, a need exists for a circuit and method for providing over-current protection in linear regulators that is responsive, reduces settle time, and effectively provides over-current protection.

Figure 2:
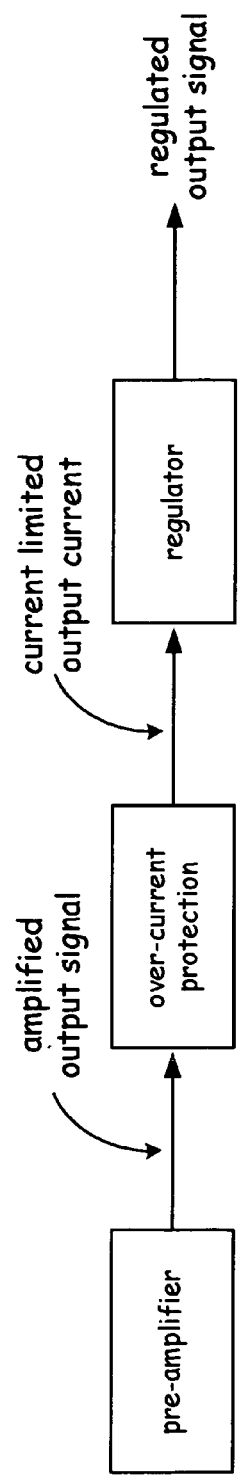
FIG. 2 is a functional block diagram of one embodiment of the present invention.
Figure 3:
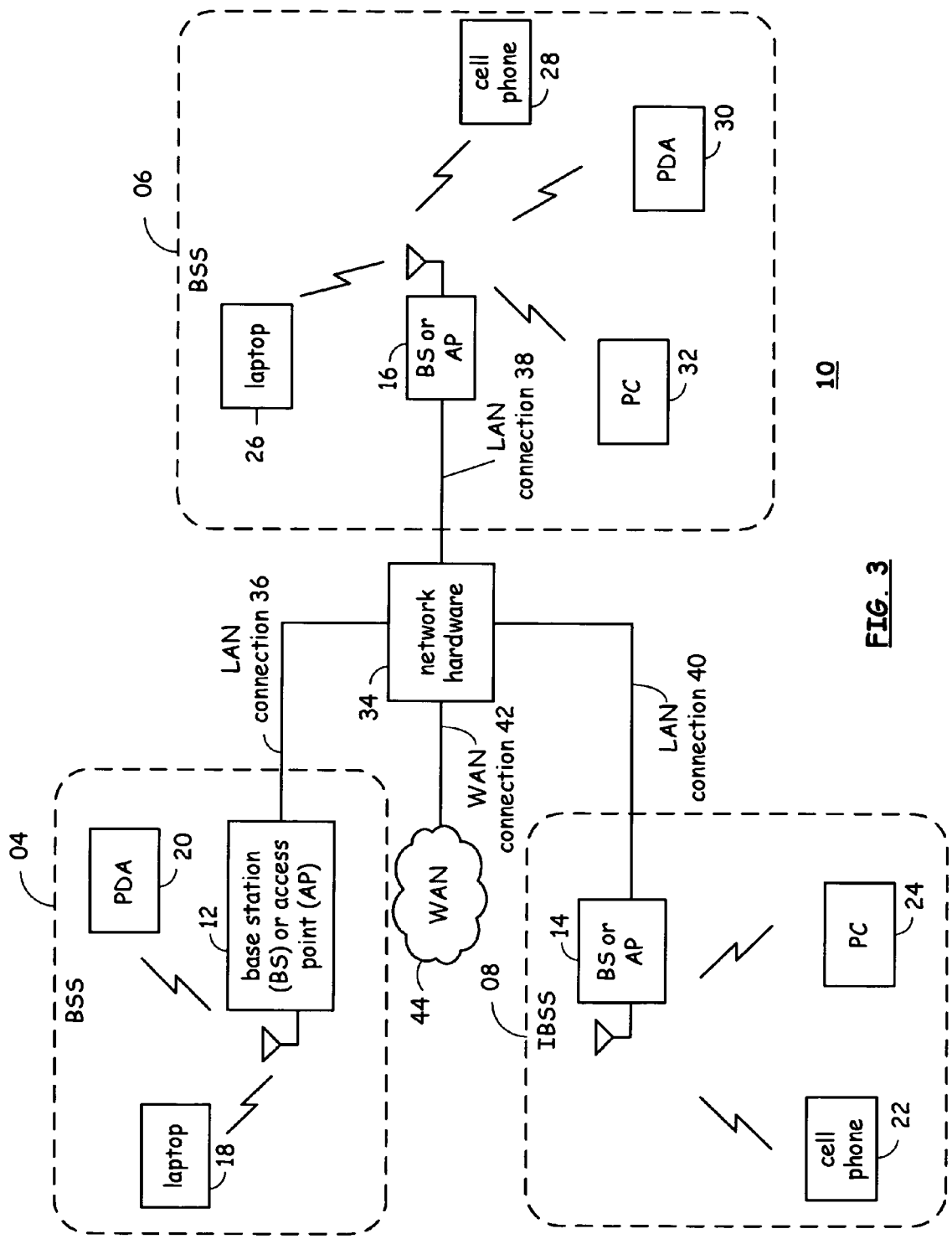
FIG. 3 is a functional block diagram illustrating a communication system that includes circuit devices and network elements and operation thereof according to one embodiment of the invention.

FIG. 2 is a functional block diagram of one embodiment of the present invention. As may be seen, a pre-amplifier provides an amplified output signal to an over-current protection block which then provides a regulated pre-amp output to a regulator. Accordingly, upon a short condition either at the output of the over-current protection block or at the regulator, the over-current protection block will be operable to provide a current limited output current, despite a short condition, to prompt the regulator to provide a regulated output signal. Accordingly, by providing a current protection detection mechanism in a regulator pre-amp, a more elegant and lower power solution is realized in contrast to a full comparator detection scheme as described in relation to FIG. 1. By regulating the input of the regulator with the over-current protection block, over-current conditions may be controlled in a manner that is schematically simpler and faster acting in addition to being a lower power solution:

FIG. 3 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 4-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

One typical application for an integrated circuit regulator is within an integrated circuit radio transceiver within any one of the above described wireless communication devices. Thus, should a short condition materialize temporarily for any one of the above described devices, the regulator of the present invention would facilitate the device being able to resume communication with minimal delay to reduce the likelihood of a missed communication.

Figure 4:
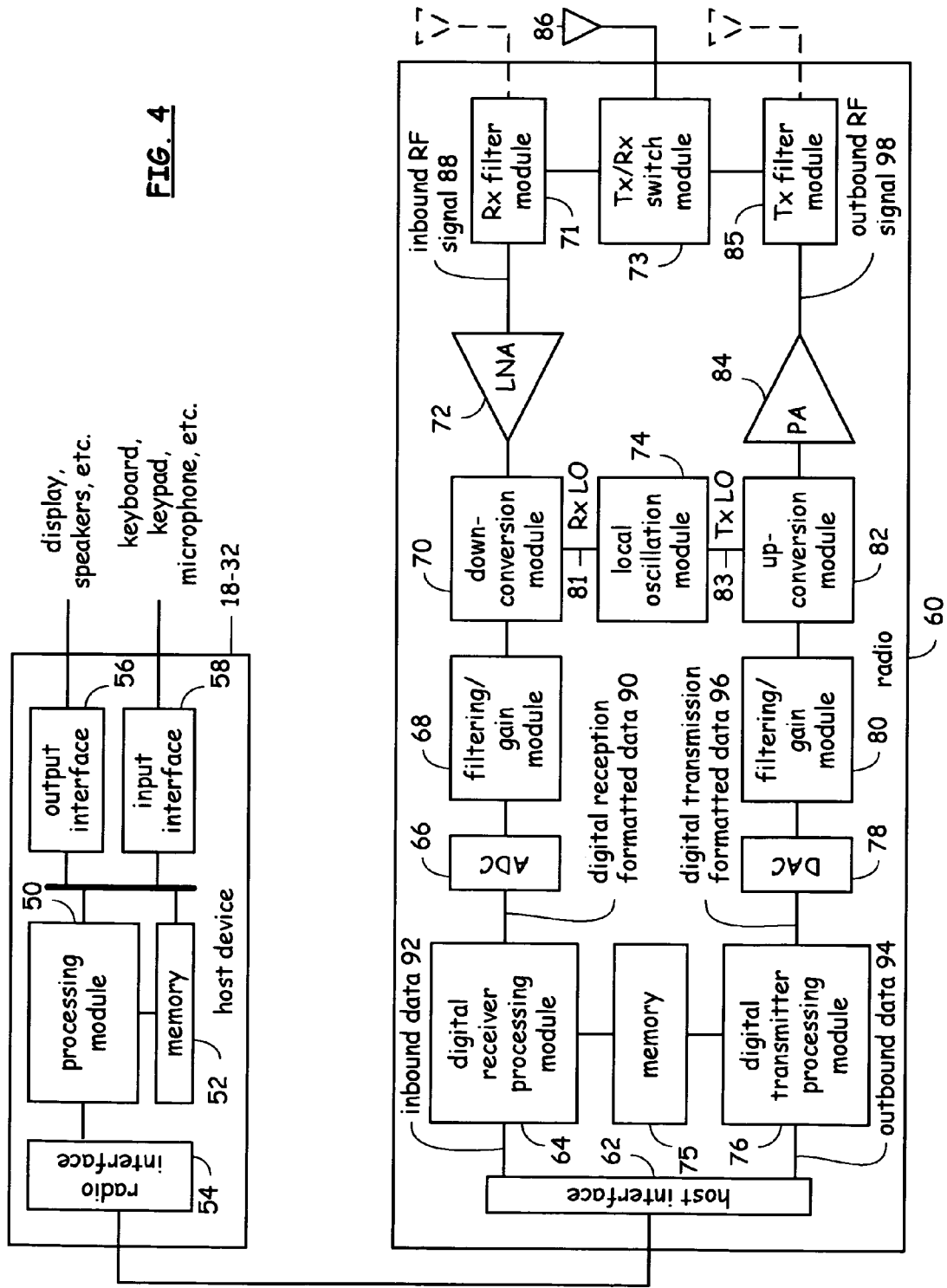
FIG. 4 is a schematic block diagram illustrating a wireless communication host device and an associated radio which may include an embodiment of the present invention for a linear regulator for providing over-current protection.

FIG. 4 is a schematic block diagram illustrating a wireless communication host device 18-32 and an associated radio 60 which may include an embodiment of the present invention for a linear regulator for providing over-current protection. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 4 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 5:
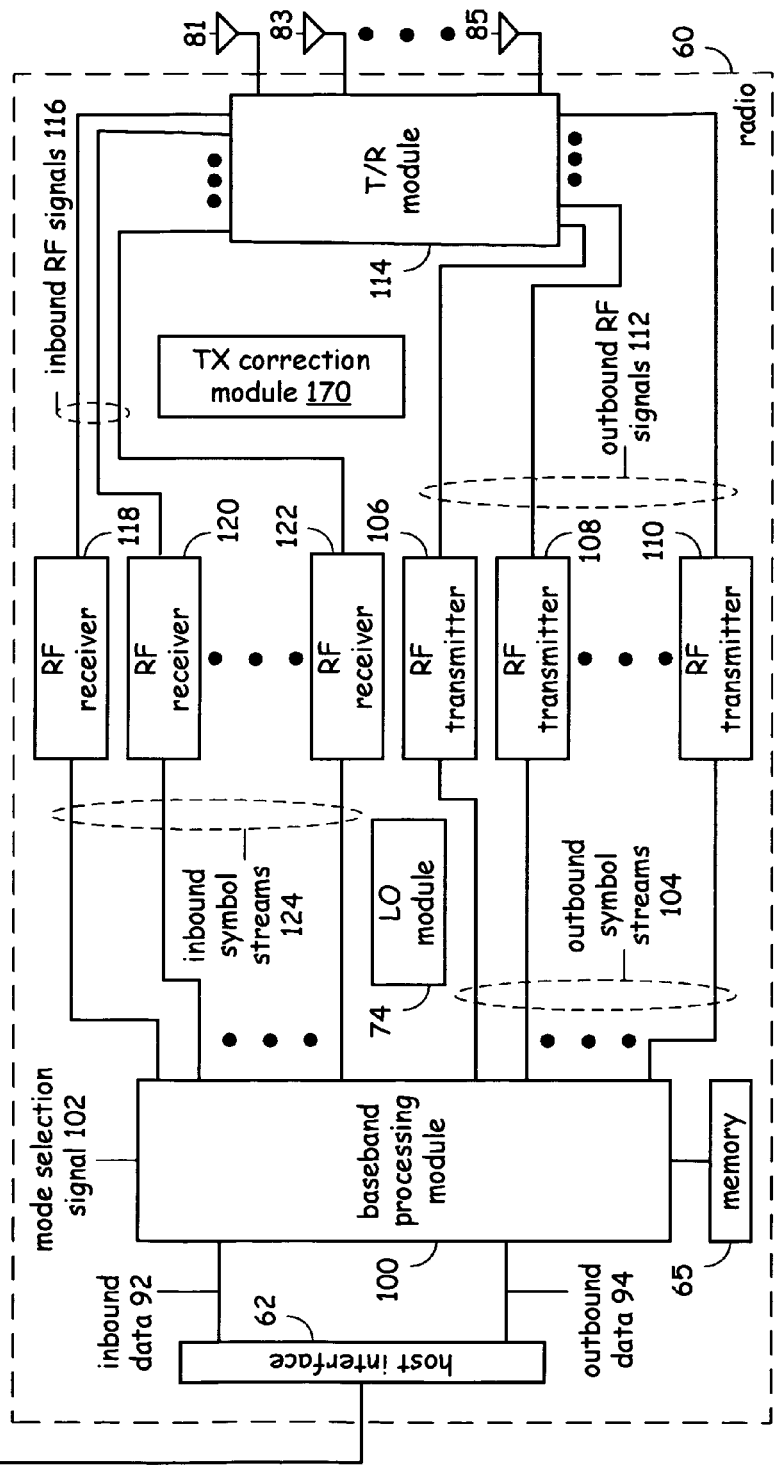
FIG. 5 is a schematic block diagram illustrating a wireless communication device that includes a host device and an associated radio 60.

FIG. 5 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 5 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 6:
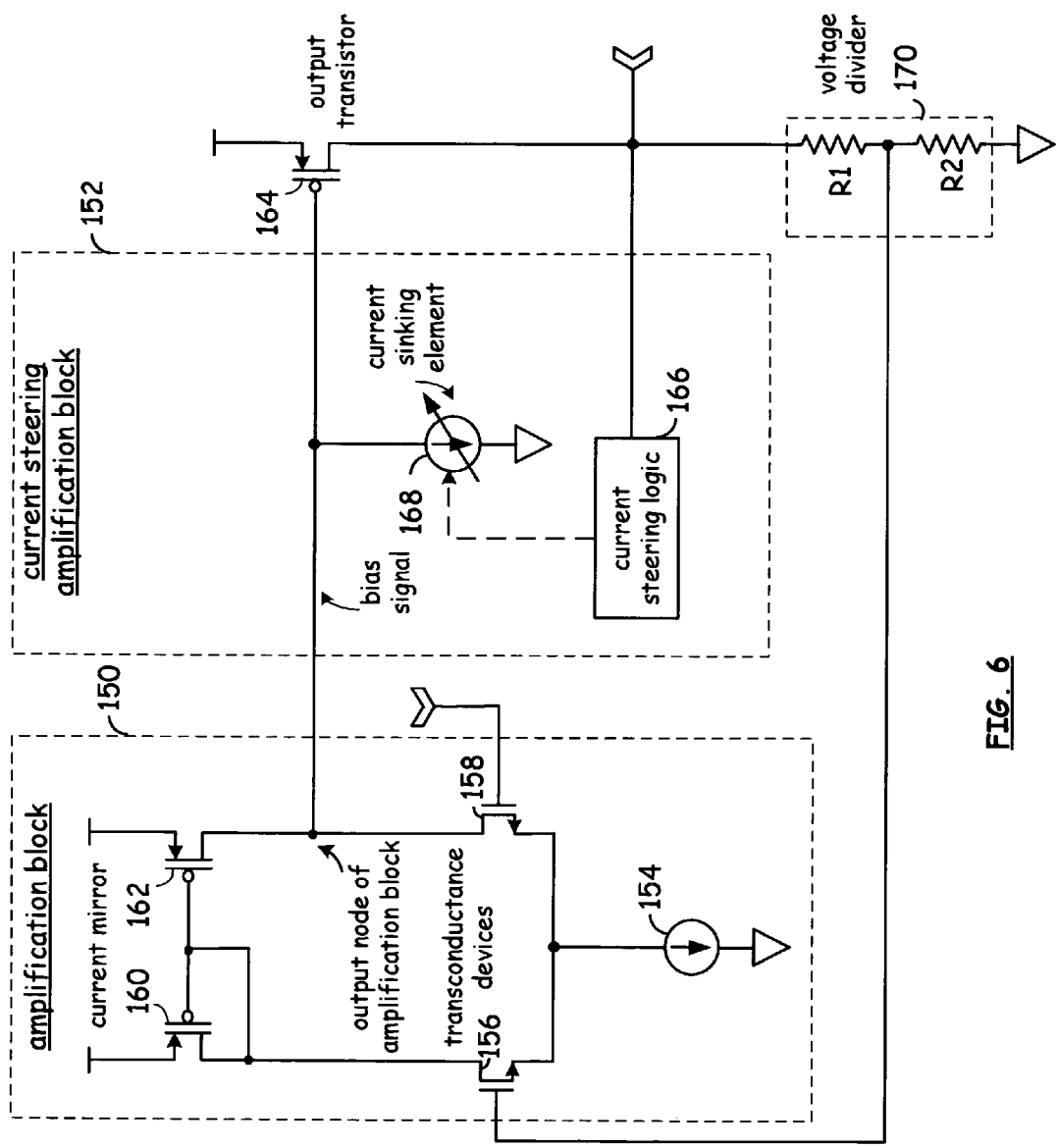
FIG. 6 is a functional schematic diagram of one embodiment of the invention of a circuit for providing over-current protection.

FIG. 6 is a functional schematic diagram of one embodiment of the invention of a circuit for providing over-current protection. Generally, FIG. 6 illustrates an amplification block 150 that is operable to produce a bias signal that biases an output transistor. The bias signal of the output transistor is propagated within a current steering amplification block 152 that includes logic for adjusting the bias signal of the output transistor and, therefore, regulating the output of the output transistor.

More specifically, amplification block 150 includes a current source 154 that provides a bias current to a transconductance amplifier formed by n-channel MOSFET transistors 156 and 158. Amplification block 150 further includes a pair of MOSFET transistors that form a current mirror that are operable to supply current to the transconductance MOSFETs 156 and 158. Specifically, p-channel MOSFETs 160 and 162 are configured as a current mirror to supply current to MOSFETs 156 and 158. The output of MOSFETs 162 and 158 generate the bias signal used to bias output transistor 164. Thus, in normal operating conditions, the bias signal produced as an output of MOSFETs 162 and 158 is operable to bias p-channel MOSFET 164, the output transistor, to produce an output current to an output node of the over-current protection circuit of FIG. 6.

Continuing the loop, the output current produced through output transistor 164 is produced to an output node and then through a voltage divider 170 comprised of resistors R1 and R2 as a part of a feedback loop that is used to operatively bias n-channel MOSFET transistor 156 of amplification block 150. The negative feedback in the loop forces the output voltage to be equal to a reference voltage provided to the gate of transistor 158*(R1+R2)/R2.

As may also be seen, current steering amplification block 152 includes current steering logic 166 that is coupled to sample or receive the output voltage signal from the drain of output transistor 164. The current steering logic 166 produces a control signal to a current sinking element 168 that is further coupled to circuit common to prompt current sinking element 168 to remove or reduce the bias signal from p-channel MOSFET 164, i.e., the output transistor, to limit the current conducted through the output transistor. Thus, in operation, as the output current of output transistor 164 tends to exceed a specified threshold, the voltage drop across voltage divider 170 increases past a specified threshold thereby prompting current steering logic 166 to generate a control signal to current sinking element 168 to remove or reduce the bias signal and to limit the current conducted through output transistor 164 to a specified level.

Figure 7:
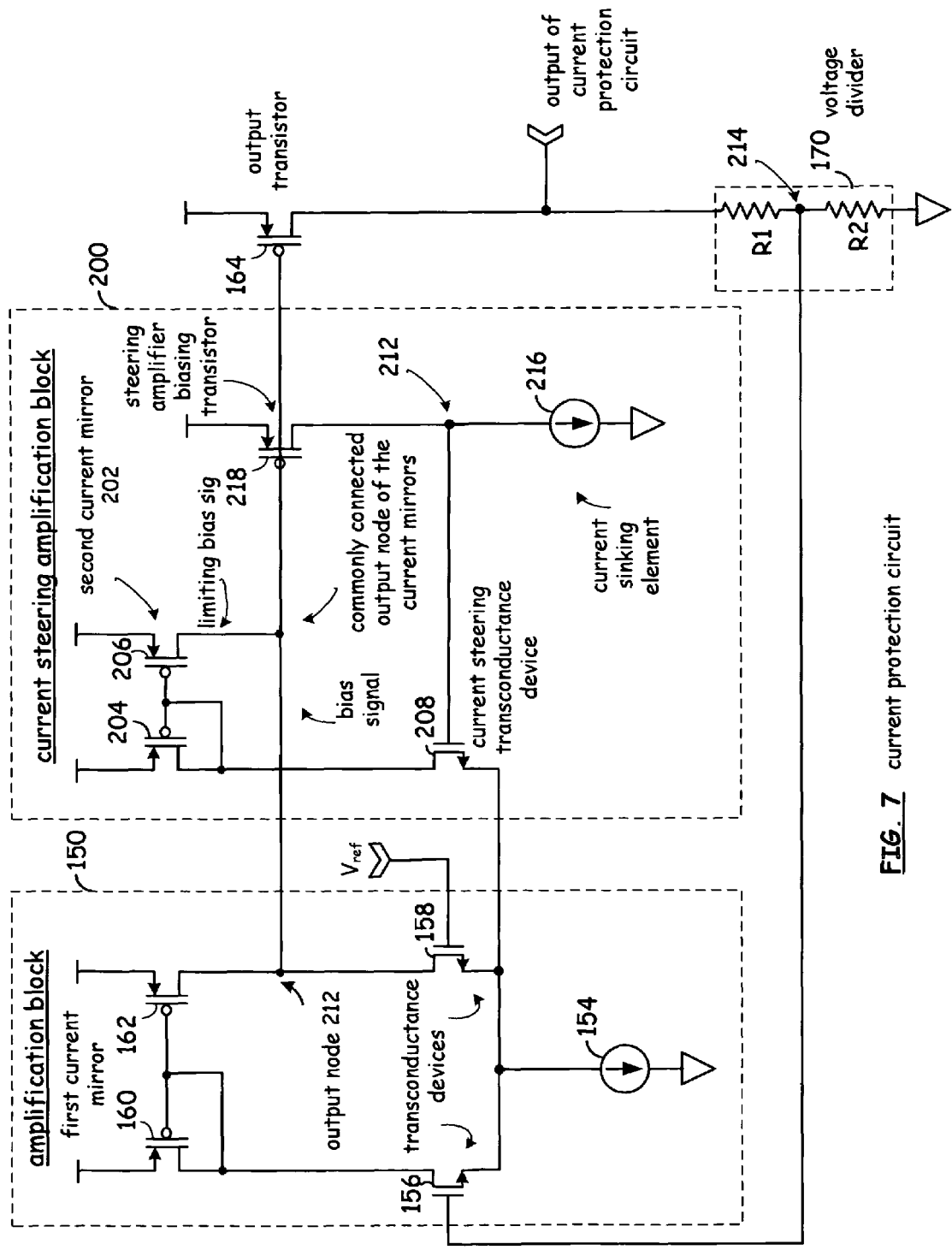
FIG. 7 is a functional schematic diagram of a current protection circuit according to one embodiment of the present invention.

FIG. 7 is a functional schematic diagram of a current protection circuit according to one embodiment of the present invention. Amplification block 150 of FIG. 7 is similar to amplification block 150 of FIG. 6. As before, a simple transconductance amplifier includes a current mirror that provides current to a pair of transconductance devices, namely MOSFETs 156 and 158, that are biased by a current source 154. The gate of MOSFET 156 is coupled to provide a bias signal from a voltage divider 170 as with the system of FIG. 6. A reference voltage $V_{ref}$ provides a bias signal for MOSFET 158. The signal produced as an output of the simple transconductance amplifier is used to operably bias output transistor 164, all as before. The primary difference between the circuits of FIG. 6 and FIG. 7 is the current steering amplification block 200 of FIG. 7 in contrast to current steering amplification block 152 of FIG. 6.

Current steering amplification block 200 includes a second current mirror 202 that, like the first current mirror of amplification block 150, is comprised of a pair of p-channel MOSFETs operably coupled as a current mirror. Specifically, the gates of MOSFETs 204 and 206 of second current mirror 202 are operably connected to each other, as well as to the drain terminal of MOSFET 204. The drain terminal of MOSFET 204 is connected to the drain terminal of an n-channel MOSFET which, in the described embodiment of the invention, is a current steering transconductance device 208. Current steering transconductance device 208, when operably biased, sinks current produced by second current mirror 202. A source terminal of current steering transconductance device 208 is further coupled to a current source 216.

In the described embodiment of the invention, second current mirror 202 and current steering transconductance device 208 are scaled to produce a substantial amount of current in relation to a current produced by amplification block 150. Accordingly, since current source 154, with the configuration shown in FIG. 7, is operably coupled or disposed to sink the current from both current steering transconductance device 208, as well as from transconductance devices (MOSFET transistors) 156 and 158 of amplification block 150, and since that amount of current is a fixed current, the operation of current steering transconductance device 208 in conjunction with second current mirror 202 tends to take over and reduce the amount of current that can be conducted by transconductance devices 156 and 158 of amplification block 150. Accordingly, the output voltage at output node 212 of amplification block 150 increases thereby reducing the amount of bias for output transistor 164. The reduced bias, therefore, reduces current flow through output transistor 164 and therefore reduces the output signal at the output node of the current protection circuit.

To further understand the operation of the circuit of FIG. 7, reference is made to nodes 212 and 214. The voltage at node 212, which is the bias voltage for output transistor 164 as well as steering amplifier biasing transistor 218, may be referenced as $V_x$, while the voltage at node 214 may be referenced as $V_y$. When the circuit of FIG. 7 is in a current limiting mode of operation, $V_x$ is substantially equal to the reference voltage $V_{ref}$ used to bias MOSFET transistor 158 (transconductance device 158). In normal operation, however, $V_y$ is equal to the reference voltage at the gate of transconductance device 158. Further, the device is scaled such that, in ordinary operation, the current provided by current sinking element (current source) 216 is substantially greater than current provided by a steering amplifier biasing transistor 218.

Steering amplifier biasing transistor 218 is scaled similarly to output transistor 164. Under normal operation, therefore, current source 216 sinks all current produced by steering amplifier biasing transistor 218. As such, a bias signal produced to the gate of current steering transconductance device 208 is not sufficient to operably bias the current steering transconductance device thereby effectively turning off the p-channel MOSFETs 204 and 206 of the second current mirror 202. As an output voltage of the first current mirror and transconductance device 158 decreases thereby increasing the bias across the source-to-gate voltage of the p-channel MOSFETs 218 and 164, namely the steering amplifier biasing transistor 218 and the output transistor 164, the bias signal level increases thereby increasing the amount of current conducted through the MOSFETs 218 and 164. As the current increases, the bias on the current steering transconductance device 208 increases thereby achieving the effect described before, which is to reduce the current conducted through transconductance devices 156 and 158 thereby increasing the output voltage of transconductance device 158 and decreasing the bias of steering amplifier biasing transistor 218 and output transistor 164 to limit or reduce the current and, especially, the output current from output transistor 164.

In general, the current protection circuit of FIG. 7 is advantageous in that the circuitry limits a regulator output at a pre-amplification stage in a manner that is responsive for fast acting, consumes less power, and has reduced settle time upon transition from a protection mode of operation to a normal mode of operation. Generally, the above-described circuitry embeds current protection into a differential pair of a regulator pre-amp in one embodiment of the invention. The current steering transconductance device 208 is normally fully off as long as the current provided by current source 216 is greater than the current provided by steering amplifier biasing transistor 218. The voltage at the gate of the current steering transconductance device 208 rises as the current in the steering amplifier biasing transistor 218 rises. Once current steering transconductance device 208 has a current that rises to a level that operably biases the current steering transconductance device 208, the above-described current limiting effects become operable to limit the bias voltage for output transistor 164 thereby limiting its output current level.

Figure 8:
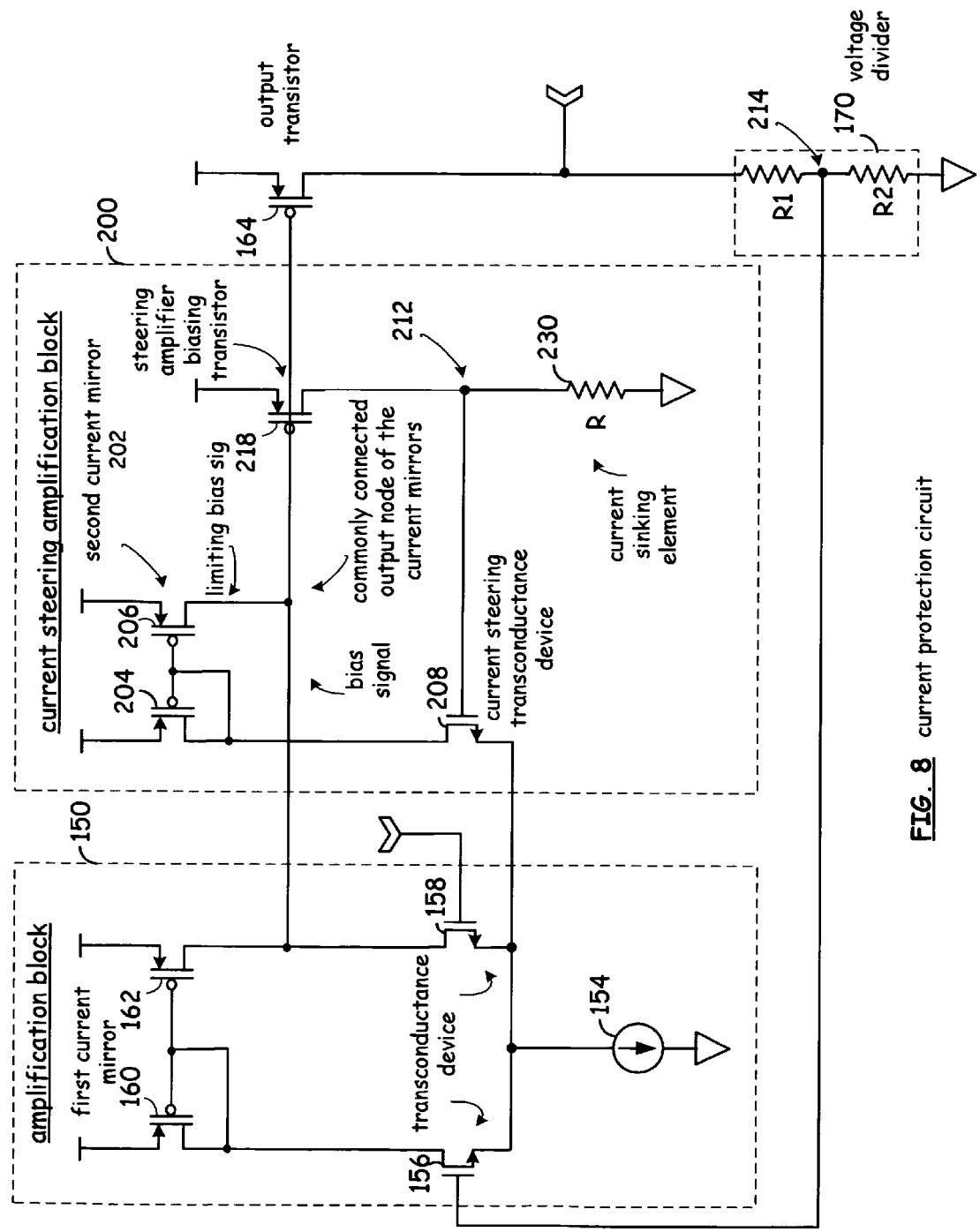
FIG. 8 is a functional schematic diagram of a current protection circuit according to one embodiment of the present invention.

FIG. 8 is a functional schematic diagram of a current protection circuit that is substantially similar to that of FIG. 7 but includes one notable difference. Specifically, current sinking element 216, which is shown to be a current source in FIG. 7, is replaced with a resistor or resistive element 230. In this embodiment, the gain of the current limiting loop is reduced, but otherwise the circuit of FIG. 8 operates as the circuit of FIG. 7. The embodiment of FIG. 8 is desirable in circumstances in which an accurate current reference is not available. Resistive element 230 may comprise either a traditional resistor, a resistor configured MOSFET, or other similar device.

Figure 9:
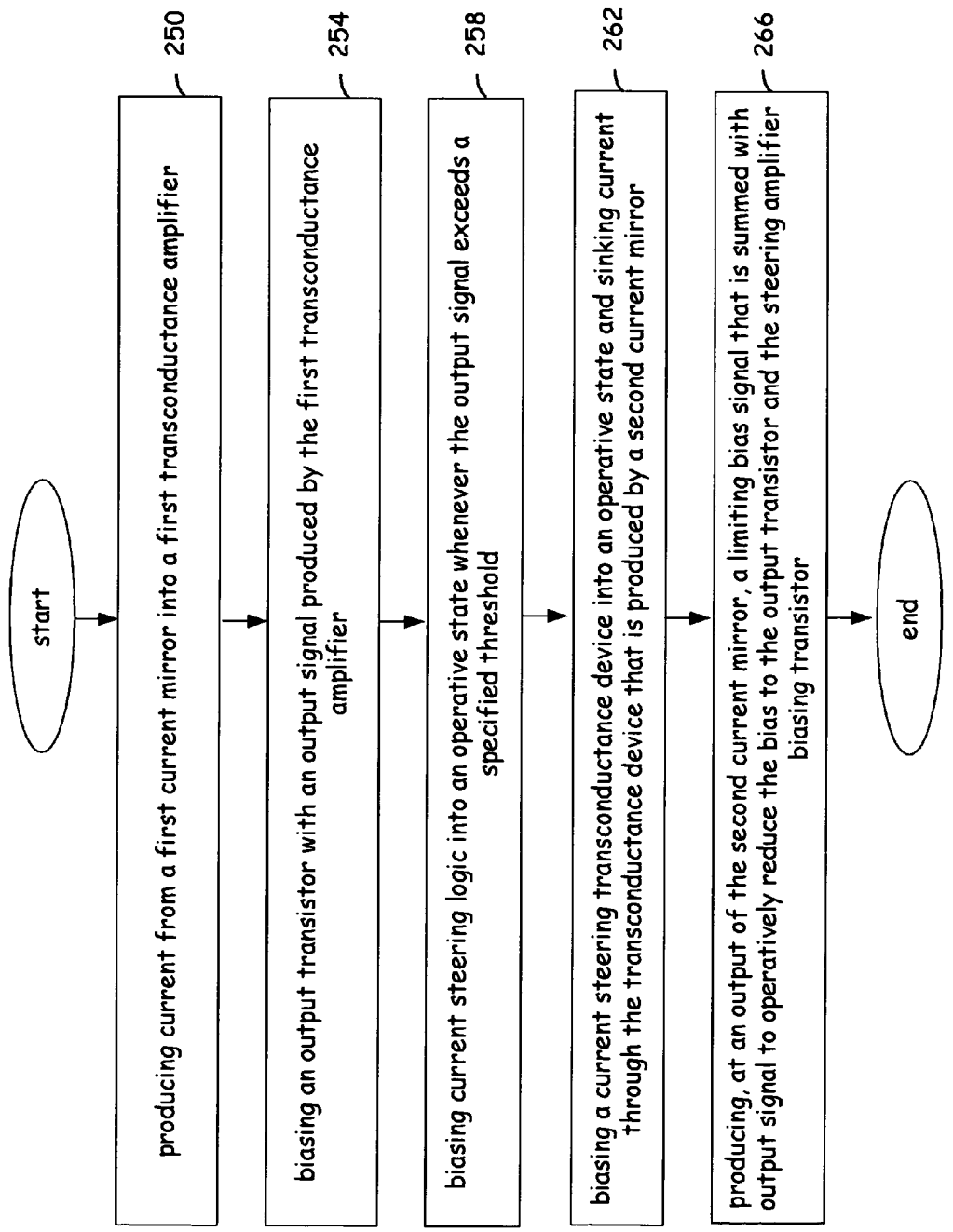
FIG. 9 is a flow chart that illustrates a method according to one embodiment of the present invention.

FIG. 9 is a flow chart that illustrates a method according to one embodiment of the present invention. Initially, the method includes producing a current from a first current mirror into a first transconductance amplifier (step 250). Thereafter, the method includes biasing an output transistor with an output signal produced by the first transconductance amplifier (step 254). As current in the output transistor reaches a specified threshold, the method includes biasing current steering logic into an operative state and reducing the bias on the output transistor by reducing the output signal used to bias the output transistor whenever the output signal exceeds a specified threshold (step 258). In one specific embodiment, an output voltage magnitude is actually increased to reduce the bias on a p-channel output transistor.

One of average skill in the art, however, may readily modify the described embodiment by using n-channel MOSFETs in place of p-channel MOSFETs, and vice versa, while substantially employing the concepts taught herein. Thus, if the output transistor, for example, is an n-channel MOSFET, then the bias is reduced by reducing the gate voltage magnitude. One of average skill in the art may readily appreciate how to adjust the teachings of the present invention for such alternate embodiments.

The inventive method further includes biasing a current steering transconductance device into an operative state and sinking current through the transconductance device that is produced by a second current mirror (step 262). The method further includes producing, at an output of a second current mirror, a limiting bias signal that is summed with the output signal to operatively reduce the bias to the output transistor and the steering amplifier biasing transistor (step 266). Thus, in addition to removing bias from the output transistor, in the described embodiments, by increasing the gate voltage magnitude, this embodiment of the present invention further includes adding a limiting bias signal that is summed at the output signal to operatively reduce the bias to the output transistor and, therefore, to the steering amplifier biasing transistor. Finally, the method of FIG. 9, as well as the embodiments of the invention as illustrated in FIG. 6-8, are generally illustrated in FIG. 2 and may be utilized with the circuits of the transceiver embodiments of FIGS. 3 and 4.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention. The embodiments of the invention may also be used in other applications. For example, several other applications beyond a current-control mechanism for a regulator take advantage that at least some of the embodiments essentially operate as a current sensor and non-linear feedback system. With this in mind, other applications include use for slew rate limiting control on a high-speed amplifier; for class- ABD amplifier switching action wherein the current sensor is used to activate switching amplifier action and, final, for sensing when slewing has stopped (opposite of slew rate control).

The invention claimed is:

1. An integrated circuit radio transceiver, comprising:
   a baseband processor operable to process ingoing digital communication signals and to produce outgoing digital communication signals;
   a transmitter front end operable to process and transmit outgoing RF signals based upon the outgoing digital communication signals;
   a receiver front end operable to receive ingoing RF signals and to process the ingoing RF signals to produce the ingoing digital communication signals to the baseband processor;
   a linear regulator with over-current protection operably disposed to regulate a power supply for providing power to at least a portion of one of the transmitter and receiver front ends,
   the linear regulator further including: an output transistor operably disposed to produce a limited output signal to a regulator;
   an amplification block for producing a bias signal for the output transistor; and
   a current steering amplification block for providing a limiting bias signal to adjust and limit the bias signal to the output transistor whenever an output current magnitude of an output current exceeds a threshold.

2. The integrated circuit radio transceiver of claim 1 wherein the limiting bias signal substantially replaces the bias signal to limit the output current produced by the output transistor.

3. The integrated circuit radio transceiver of claim 1 wherein the limiting bias signal reduces the bias signal to limit the output current produced by the output transistor.

4. The integrated circuit radio transceiver of claim 1 wherein the current steering amplification block is biased into an off condition during normal operation of the linear regulator.

5. The integrated circuit radio transceiver of claim 1 wherein the current steering amplification block is biased into an on condition whenever the output current magnitude of the output current exceeds the specified threshold wherein the current steering amplification block is operable to sink excess current produced by the amplification block during the low impedance output condition.

6. The integrated circuit radio transceiver of claim 1 wherein the current steering amplification block comprises amplification circuitry that is operably disposed to bias into an on state whenever the output current reaches the specified threshold through the output transistor.

7. The integrated circuit radio transceiver of claim 6 wherein the specified threshold is based at least partially upon a current source disposed within the current steering amplification block.

8. The integrated circuit radio transceiver of claim 6 wherein the specified threshold is at least partially based upon a resistor disposed within the current steering amplification block, which resistor defines a current level specified by a reference voltage divided by the resistor.

9. The integrated circuit radio transceiver of claim 1 comprising similar first and second current mirrors disposed within the amplification block and within the current steering amplification block respectively, the first and second current mirrors having a commonly connected output node further connected to a gate terminal of the output transistor.

10. The integrated circuit radio transceiver of claim 9 wherein the commonly connected output node is further connected to a gate terminal of a steering amplifier biasing transistor disposed to produce a current to operably bias a transconductance device of the current steering amplification block to cause the current steering amplification block to steer current away from the gate of the output transistor.

11. The integrated circuit radio transceiver of claim 10 wherein the current steering amplification block further includes a current sinking element.

12. The integrated circuit radio transceiver of claim 11 wherein the current sinking element comprises one of a current source or a resistor coupled to circuit common.

13. An integrated circuit radio transceiver linear regulator, comprising:
   an output transistor for producing a current into an output node of the regulator;
   an amplification block operable to produce a bias signal to a gate terminal of the output transistor to operably bias the output transistor to produce the current into the output node of the regulator;
   a current steering amplification block for steering current out of the gate of the output transistor based upon the current being conducted through the output node of the regulator exceeding a specified threshold; and
   the current steering amplification block further including a current sinking element operably disposed to sink a specified amount of current to define the specified threshold.

14. The integrated circuit radio transceiver linear regulator of claim 13 wherein the amplification block includes a first current mirror operably disposed to source current into an amplification stage of the amplification block further comprising a first input MOSFET having a gate coupled to a voltage divider block further coupled to receive and sink current produced by the output transistor and a second input MOSFET coupled to a reference signal.

15. The integrated circuit radio transceiver linear regulator of claim 14 wherein the first current mirror comprises p-channel MOSFETs and the amplification block comprises n-channel MOSFETs.

16. The integrated circuit radio transceiver linear regulator of claim 13 further including a steering amplifier biasing transistor operably disposed to produce current into the current sinking element and operable to produce a current steering transconductance device bias signal.

17. The integrated circuit radio transceiver linear regulator of claim 16 wherein the current sinking element comprises a current source.

18. The integrated circuit radio transceiver linear regulator of claim 16 wherein the current sinking element comprises a resistive element.

19. The integrated circuit radio transceiver linear regulator of claim 13 further including, within the current steering amplification block, a second current mirror and a current steering transconductance device operably disposed to sink current produced by the second mirror based upon the current steering transconductance device bias signal.

20. The integrated circuit radio transceiver linear regulator of claim 13 wherein the second current mirror, when providing current to the current steering transconductance device, operably decreases a bias signal for the output transistor to limit an output current level of the integrated circuit radio transceiver linear regulator.

* * * * *